(12) United States Patent
Ho et al.

(10) Patent No.: US 10,163,984 B1
(45) Date of Patent: Dec. 25, 2018

(54) DISPLAY WITH EMBEDDED COMPONENTS AND SUBPIXEL WINDOWS

(71) Applicant: Apple Inc., Cupertino, CA (US)

(72) Inventors: Meng-Huan Ho, Hsinchu (TW); Minhyuk Choi, San Jose, CA (US); Chin-Wei Lin, Cupertino, CA (US); Shih Chang Chang, Cupertino, CA (US); Jae Won Choi, Cupertino, CA (US); Jun Jiang, Campbell, CA (US); Rui Liu, San Jose, CA (US); Cheng Chen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/263,231

(22) Filed: Sep. 12, 2016

(51) Int. Cl.
*H01L 27/32* (2006.01)
*G06K 9/00* (2006.01)

(52) U.S. Cl.
CPC ...... *H01L 27/3216* (2013.01); *G06K 9/00033* (2013.01); *H01L 27/3227* (2013.01)

(58) Field of Classification Search
CPC ... H01L 27/32; H01L 27/3206; H01L 27/3211
See application file for complete search history.

(56) References Cited

U.S. PATENT DOCUMENTS

| 5,726,443 | A | 3/1998 | Immega et al. |
|---|---|---|---|
| 6,075,316 | A | 6/2000 | Shi et al. |
| 6,339,429 | B1 | 1/2002 | Schug |
| 6,430,325 | B1 | 8/2002 | Shimoda |
| 6,459,436 | B1 | 10/2002 | Kumada |
| 6,537,688 | B2 | 3/2003 | Silvernail et al. |
| 7,164,961 | B2 | 1/2007 | Mei et al. |
| 7,450,105 | B2 | 11/2008 | Nakamura et al. |
| 7,460,196 | B2 | 12/2008 | Kim |

(Continued)

FOREIGN PATENT DOCUMENTS

| EP | 1335430 | 8/2003 |
|---|---|---|
| EP | 2144293 | 1/2010 |

(Continued)

OTHER PUBLICATIONS

US 4,379,180, 04/1983, Baglin et al. (withdrawn)
Choi et al., U.S. Appl. No. 15/274,546, filed Sep. 23, 2016.
Choi et al., U.S. Appl. No. 15/257,374, filed Sep. 6, 2016.

*Primary Examiner* — Hoai V Pham
(74) *Attorney, Agent, or Firm* — Treyz Law Group, P.C.; G. Victor Treyz; Joseph F. Guihan

(57) ABSTRACT

A display may have an array of pixels. Each pixel may have a light-emitting diode such as an organic light-emitting diode. The organic light-emitting diodes may each have an anode that is coupled to a thin-film transistor pixel circuit for controlling the anode. Transparent windows may be formed in the display. The windows may be formed by replacing subpixels in some of the pixels with transparent windows. When subpixels are replaced by transparent windows, adjacent subpixels may be overdriven to compensate for lost light from the replaced subpixels. Adjacent subpixels may also be enlarged to help compensate for lost light. An array of electrical components such as an array of light sensors may be aligned with the transparent windows and may be used to measure light passing through the transparent windows.

21 Claims, 8 Drawing Sheets

(56) References Cited

U.S. PATENT DOCUMENTS

| | | |
|---|---|---|
| 7,468,721 B2 | 12/2008 | Nakano |
| 7,804,493 B2 | 9/2010 | Gettemy |
| 7,825,891 B2 | 11/2010 | Yao et al. |
| 7,960,682 B2 | 6/2011 | Gardner, Jr. |
| 7,999,454 B2 | 8/2011 | Winters et al. |
| 8,013,817 B2 | 9/2011 | Miller et al. |
| 8,194,031 B2 | 6/2012 | Yao et al. |
| 8,330,909 B2 | 12/2012 | Yoshida et al. |
| 8,361,818 B2 | 1/2013 | Cho et al. |
| 8,384,003 B2 | 2/2013 | Gardner, Jr. |
| 8,724,304 B2 | 5/2014 | Raff et al. |
| 8,947,627 B2 | 2/2015 | Rappoport et al. |
| 8,987,652 B2 | 3/2015 | Zheng et al. |
| 9,024,530 B2 | 5/2015 | Land et al. |
| 9,028,718 B2 | 5/2015 | Kijima et al. |
| 9,129,548 B2 | 5/2015 | Zheng et al. |
| 9,070,648 B2 | 6/2015 | Jong et al. |
| 9,223,442 B2 | 12/2015 | Hoffman |
| 9,245,934 B2 | 1/2016 | Chung et al. |
| 9,299,748 B2 | 3/2016 | Schicktanz et al. |
| 9,310,843 B2 | 4/2016 | Shedletsky et al. |
| 9,354,735 B2 | 5/2016 | Abileah et al. |
| 9,466,653 B2 | 10/2016 | Jong et al. |
| 9,531,970 B2 | 12/2016 | Haji-Khamneh et al. |
| 9,543,364 B2 | 1/2017 | Rappoport et al. |
| 9,620,571 B2 | 4/2017 | Shedletsky et al. |
| 9,825,103 B2 | 11/2017 | Rappoport et al. |
| 2001/0000676 A1 | 5/2001 | Zhang et al. |
| 2002/0079512 A1 | 6/2002 | Yamazaki et al. |
| 2003/0174870 A1 | 9/2003 | Kim et al. |
| 2003/0189211 A1 | 10/2003 | Deitz |
| 2003/0189586 A1 | 10/2003 | Vronay |
| 2004/0036820 A1 | 2/2004 | Runolinna |
| 2004/0095402 A1 | 5/2004 | Nakano |
| 2004/0140762 A1 | 7/2004 | Tohma et al. |
| 2005/0056842 A1 | 3/2005 | Nashi et al. |
| 2005/0219197 A1 | 10/2005 | Pasqualini et al. |
| 2006/0033016 A1 | 2/2006 | Ogawa et al. |
| 2006/0049533 A1 | 3/2006 | Kamoshita |
| 2006/0180890 A1 | 8/2006 | Naugler et al. |
| 2006/0238517 A1 | 10/2006 | King et al. |
| 2006/0267625 A1 | 11/2006 | Kaneko |
| 2007/0236485 A1 | 10/2007 | Trepte |
| 2007/0257254 A1 | 11/2007 | Yang et al. |
| 2008/0084374 A1 | 4/2008 | Abileah et al. |
| 2008/0158173 A1 | 7/2008 | Hamblin et al. |
| 2008/0284716 A1 | 11/2008 | Edwards |
| 2009/0002341 A1 | 1/2009 | Saito et al. |
| 2009/0033850 A1 | 2/2009 | Ishiguro et al. |
| 2009/0102763 A1 | 4/2009 | Border et al. |
| 2010/0079426 A1 | 4/2010 | Pance et al. |
| 2010/0115407 A1 | 5/2010 | Kim et al. |
| 2010/0148163 A1 | 6/2010 | Im et al. |
| 2010/0165267 A1 | 7/2010 | Yoshida et al. |
| 2010/0177046 A1 | 7/2010 | Shin et al. |
| 2010/0273530 A1 | 10/2010 | Jarvis et al. |
| 2010/0302196 A1 | 12/2010 | Han et al. |
| 2011/0122560 A1 | 5/2011 | Andre et al. |
| 2011/0195758 A1 | 8/2011 | Damale et al. |
| 2011/0210825 A1 | 9/2011 | Murakami et al. |
| 2011/0216042 A1 | 9/2011 | Wassvik et al. |
| 2011/0220922 A1 | 9/2011 | Kim et al. |
| 2011/0221705 A1 | 9/2011 | Yi et al. |
| 2011/0227873 A1 | 9/2011 | Chung et al. |
| 2011/0234538 A1 | 9/2011 | Chen et al. |
| 2011/0248961 A1 | 10/2011 | Svajda et al. |
| 2012/0043894 A1 | 2/2012 | Koh |
| 2012/0153153 A1 | 6/2012 | Change et al. |
| 2012/0176298 A1 | 7/2012 | Suh et al. |
| 2012/0194441 A1 | 8/2012 | Frey |
| 2012/0218239 A1 | 8/2012 | Yao et al. |
| 2012/0256089 A1 | 10/2012 | Kanda et al. |
| 2012/0267611 A1 | 10/2012 | Chung et al. |
| 2012/0274596 A1 | 11/2012 | Ludwig |
| 2013/0002731 A1 | 1/2013 | Tam |
| 2013/0076712 A1 | 3/2013 | Zheng et al. |
| 2013/0094126 A1 | 4/2013 | Rappoport et al. |
| 2013/0106813 A1 | 5/2013 | Hotelling et al. |
| 2013/0161489 A1 | 6/2013 | Gardner |
| 2014/0085265 A1 | 3/2014 | Yin |
| 2014/0183342 A1 | 7/2014 | Shedletsky et al. |
| 2015/0160767 A1 | 6/2015 | Song et al. |
| 2015/0206926 A1 | 7/2015 | Hong et al. |
| 2015/0279918 A1* | 10/2015 | Teraguchi .......... H01L 27/3276 257/40 |
| 2015/0331508 A1 | 11/2015 | Nho et al. |
| 2017/0005154 A1* | 1/2017 | You .................... H01L 27/3262 |
| 2017/0214004 A1 | 7/2017 | Shedletsky et al. |
| 2018/0069060 A1 | 3/2018 | Rappoport et al. |

FOREIGN PATENT DOCUMENTS

| | | |
|---|---|---|
| EP | 2432196 | 3/2012 |
| GB | 2439584 | 1/2008 |
| TW | 201237962 | 9/2012 |
| WO | 2000/41378 | 7/2000 |
| WO | 2002/37454 | 5/2002 |
| WO | 2007/069107 | 6/2007 |
| WO | 2017048478 | 3/2017 |

* cited by examiner

DISPLAY WITH EMBEDDED COMPONENTS AND SUBPIXEL WINDOWS

BACKGROUND

This relates generally to electronic devices, and, more particularly, to electronic devices with displays.

Electronic devices often include displays. Displays such as organic light-emitting diode displays have pixels with light-emitting diodes. The light emitting diodes each have electrodes (i.e., an anode and a cathode). Emissive material is interposed between the electrodes. During operation, current passes through the emissive material between the electrodes, generating light.

The electrodes in an organic light-emitting diode display are formed from a photolithographically patterned layer of conductive material. Electrodes are organized in a regularly spaced array. This type of arrangement simplifies the layout of thin-film transistor circuits for the display.

It may be desirable to incorporate electrical components into a display. If care is not taken, the electrodes and other circuitry in a display may interfere with these components.

It would therefore be desirable to be able to provide improved display arrangements for accommodating the addition of electrical components.

SUMMARY

A display may have an array of pixels. Each pixel may have a light-emitting diode such as an organic light-emitting diode. The organic light-emitting diodes may each have an anode that is coupled to an associated pixel circuit. The pixel circuit may include thin-film transistor circuitry for controlling the anode.

Transparent windows may be formed by replacing subpixels in some of the pixels with transparent windows. When subpixels are replaced by transparent windows, adjacent subpixels may be overdriven to compensate for lost light from the replaced subpixels. Adjacent subpixels may also be enlarged to help compensate for lost light.

Further features will be more apparent from the accompanying drawings and the following detailed description.

DETAILED DESCRIPTION

Figure 1:
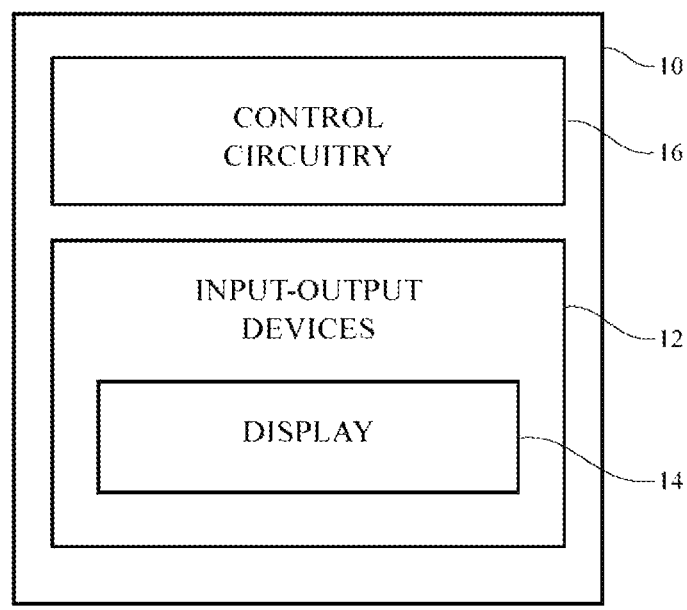
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, and other electrical components. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
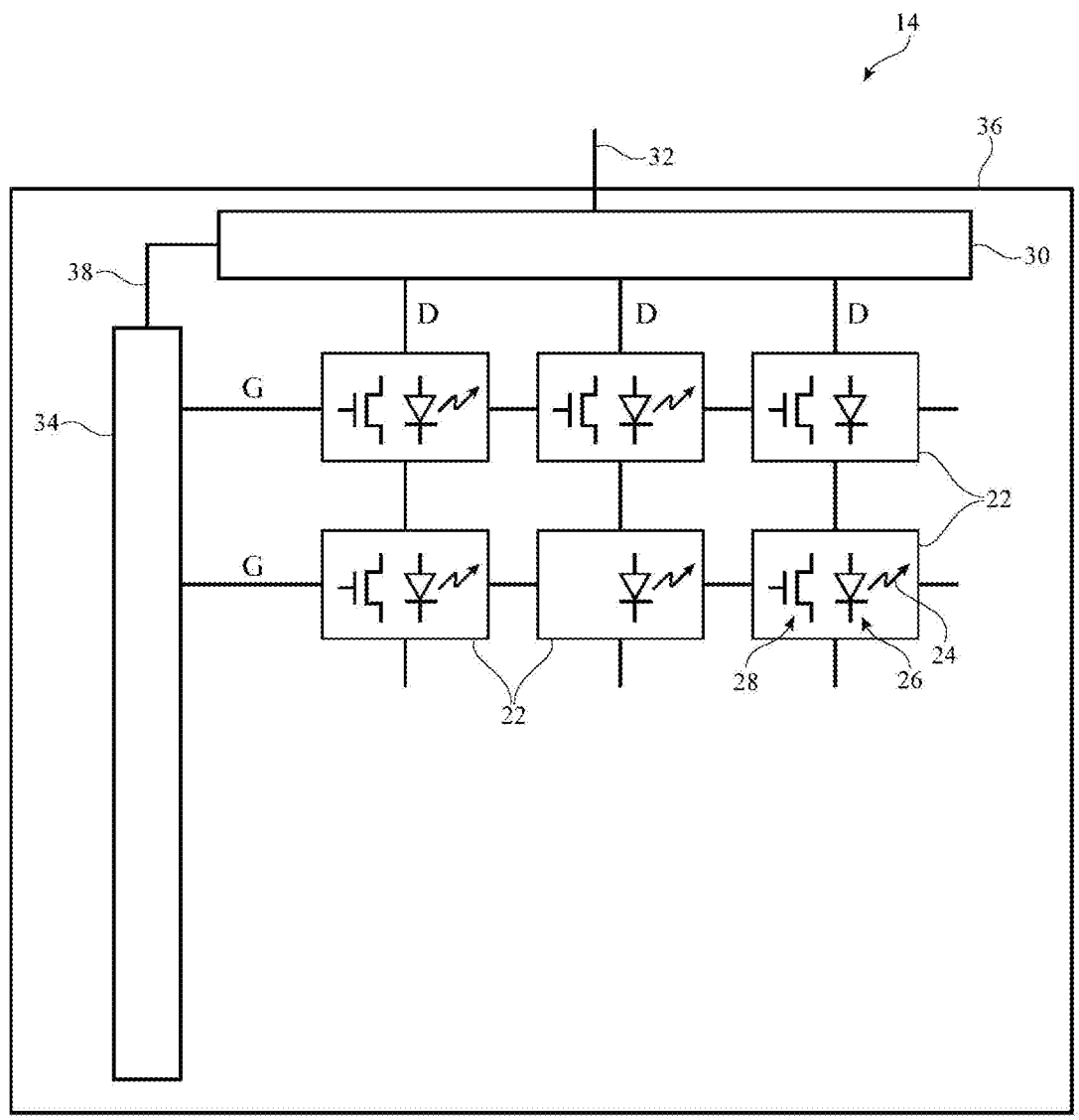
FIG. 2 is a top view of an illustrative display in an electronic device in accordance with an embodiment.
Figure 2:
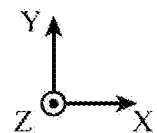

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel circuit formed from thin-film transistor circuitry such as thin-film transistors 28 and thin-film capacitors). Thin-film transistors 28 may be polysilicon thin-film transistors, semiconducting-oxide thin-film transistors such as indium gallium zinc oxide transistors, or thin-film transistors formed from other semiconductors. Pixels 22 may contain light-emitting diodes of different colors (e.g., red, green, and blue diodes for red, green, and blue pixels, respectively) to provide display 14 with the ability to display color images.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14.

Gate driver circuitry 34 (sometimes referred to as horizontal control line control circuitry) may be implemented as part of an integrated circuit and/or may be implemented using thin-film transistor circuitry. Horizontal control lines G in display 14 may carry gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Figure 3:
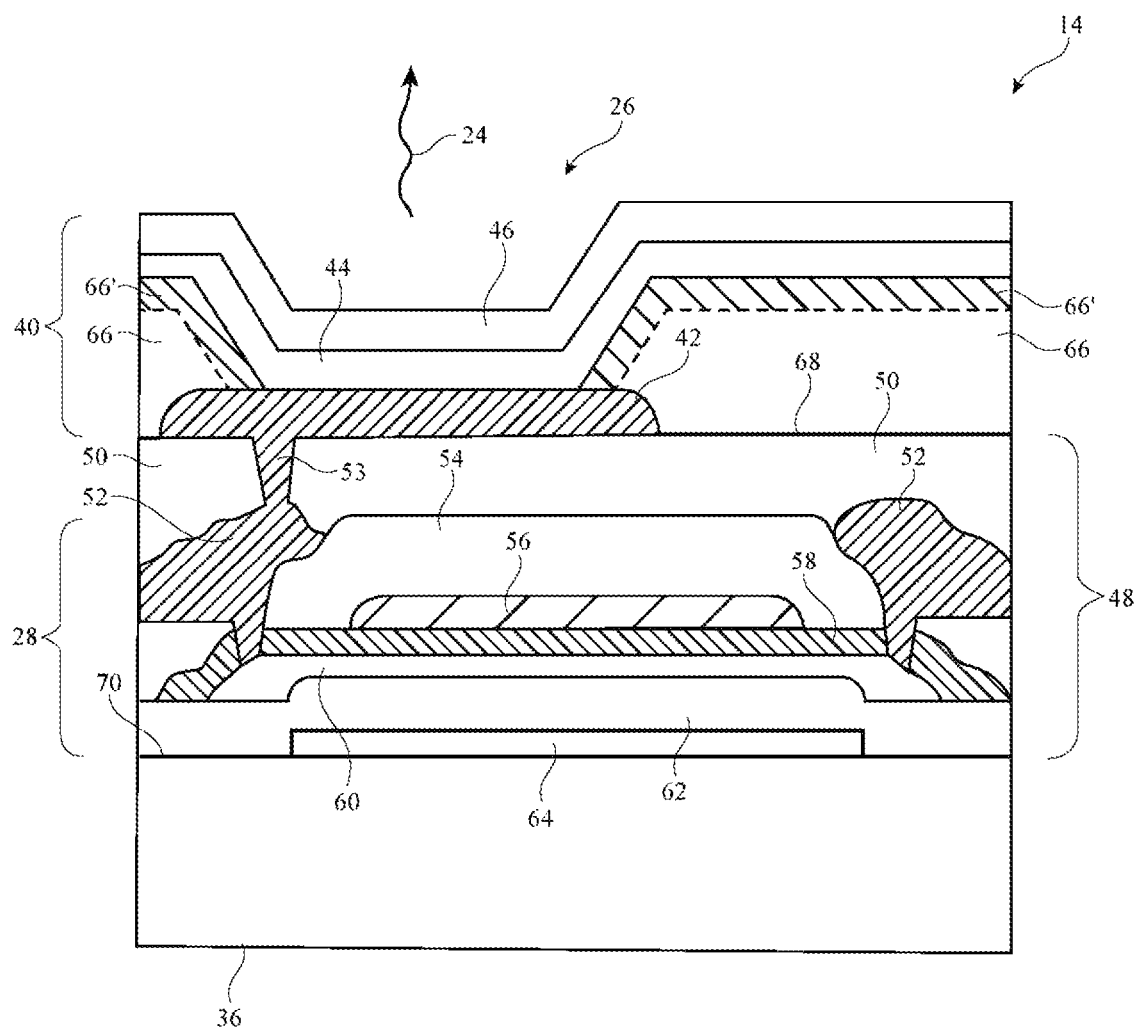
FIG. 3 is a cross-sectional side view of a portion of an illustrative organic light-emitting diode display in accordance with an embodiment.

A cross-sectional side view of a portion of an illustrative organic light-emitting diode display that includes a light-emitting diode (diode 26) and thin-film transistor circuitry for an associated pixel circuit (pixel circuit 48) is shown in FIG. 3. As shown in FIG. 3, display 14 may include a substrate layer such as substrate layer 36. Substrate 36 may be a planar layer or a non-planar layer and may be formed from plastic, glass, ceramic, sapphire, metal, or other suitable materials. The surface of substrate 36 may, if desired, be covered with one or more buffer layers (e.g., inorganic buffer layers such as layers of silicon oxide, silicon nitride, etc.).

Thin-film transistor circuitry for pixel circuit 48 may be formed on substrate 36. The thin film transistor circuitry may include transistors, capacitors, and other thin-film structures. As shown in FIG. 3, a transistor such as thin-film transistor 28 may be formed from thin-film semiconductor layer 60. Semiconductor layer 60 may be a polysilicon layer, a semiconducting-oxide layer such as a layer of indium gallium zinc oxide, or other semiconductor layer. Gate layer 56 may be a conductive layer such as a metal layer that is separated from semiconductor layer 60 by an intervening layer of dielectric such as dielectric 58 (e.g., an inorganic gate insulator layer such as a layer of silicon oxide). Dielectric 62 may also be used to separate semiconductor layer 60 from underlying structures such as shield layer 64 (e.g., a shield layer that helps shield the transistor formed from semiconductor layer 60 from charge in buffer layers on substrate 36).

Semiconductor layer 60 of transistor 28 may be contacted by source and drain terminals formed from source-drain metal layer 52. Dielectric layer 54 (e.g., an inorganic dielectric layer) may separate gate metal layer 56 from source-drain metal layer 52. Pixel circuit 48 (e.g., source-drain metal layer 52) may be shorted to anode 42 of light-emitting diode 26 using a metal via such as via 53 that passes through dielectric planarization layer 50. Planarization layer 50 may be formed from an organic dielectric material such as a polymer.

Light-emitting diode 26 is formed from light-emitting diode layers 40 on the thin-film transistor layers of pixel circuit 48. Each light-emitting diode has a lower electrode and an upper electrode. In a top emission display, the lower electrode may be formed from a reflective conductive material such as patterned metal to help reflect light that is produced by the light-emitting diode in the upwards direction out of the display. The upper electrode (sometimes referred to as the counter electrode) may be formed from a transparent or semi-transparent conductive layer (e.g., a thin layer of transparent or semitransparent metal and/or a layer of indium tin oxide or other transparent conductive material). This allows the upper electrode to transmit light outwards that has been produced by emissive material in the diode. In a bottom emission display, the lower electrode may be transparent (or semi-transparent) and the upper electrode may be reflective.

In configurations in which the anode is the lower electrode, layers such as a hole injection layer, hole transport layer, emissive material layer, and electron transport layer may be formed above the anode and below the upper electrode, which serves as the cathode for the diode. In inverted configurations in which the cathode is the lower electrode, layers such as an electron transport layer, emissive material layer, hole transport layer, and hole injection layer may be stacked on top of the cathode and may be covered with an upper layer that serves as the anode for the diode. Both electrodes may reflect light.

In general, display 14 may use a configuration in which the anode electrode is closer to the display substrate than the cathode electrode or a configuration in which the cathode electrode is closer to the display substrate than the anode electrode. In addition, both bottom emission and top emission arrangements may be used. Top emission display configurations in which the anode is located on the bottom and the cathode is located on the top are sometimes described herein as an example. This is, however, merely illustrative. Any suitable display arrangement may be used, if desired.

In the illustrative configuration of FIG. 3, display 14 has a top emission configuration and lower electrode 42 is an anode and upper electrode 46 is a cathode. Layers 40 include a patterned metal layer that forms anodes such as anode 42. Anode 42 is formed within an opening in pixel definition layer 66. Pixel definition layer 66 may be formed from a patterned photoimageable polymer. The photoimageable polymer may be formed from an opaque material and/or a layer of opaque material such as black masking layer 66' may cover other material in layer 66 (e.g., opaque layer 66' may cover a layer of semitransparent polyimide or other polymer).

In each light-emitting diode, organic emissive material 44 is interposed between a respective anode 42 and cathode 46. Anodes 42 may be patterned from a layer of metal on a planarization layer in the thin-film transistor layers of pixel circuit 48 such as planarization layer 50. Cathode 46 may be formed from a common conductive layer that is deposited on top of pixel definition layer 66. Cathode 46 is transparent so that light 24 may exit light emitting diode 26 as current is flowing through emissive material 44 between anode 42 and cathode 46.

Figure 4:
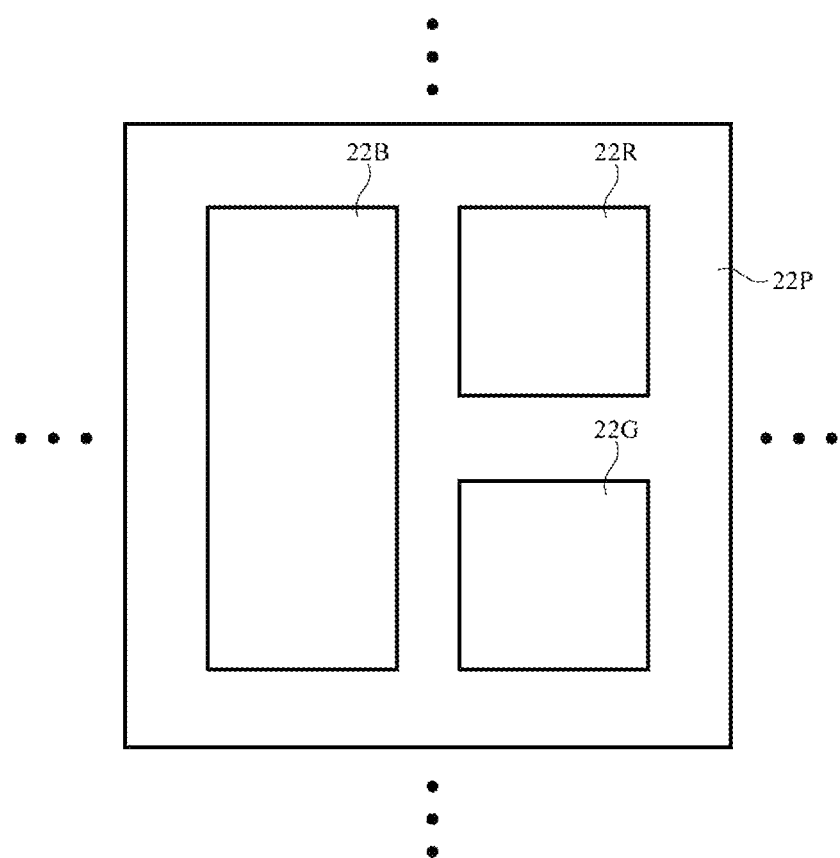
FIG. 4 is a diagram of an illustrative pixel cell having pixels of different colors in accordance with an embodiment.

Display 14 may have an array of pixels 22 of different colors to provide display 14 with the ability to display color images. As shown in FIG. 4, each pixel cell 22P in display 14 may contain a red pixel 22R, a green pixel 22G, and a blue pixel 22B (as an example). These pixels, which may sometimes be referred to as subpixels, may have rectangular emissive areas (e.g., rectangular anode shapes) and/or may have emissive areas of other suitable shapes. White pixels, yellow pixels, and pixels of other colors may also be included in display 14, if desired.

Figure 5:
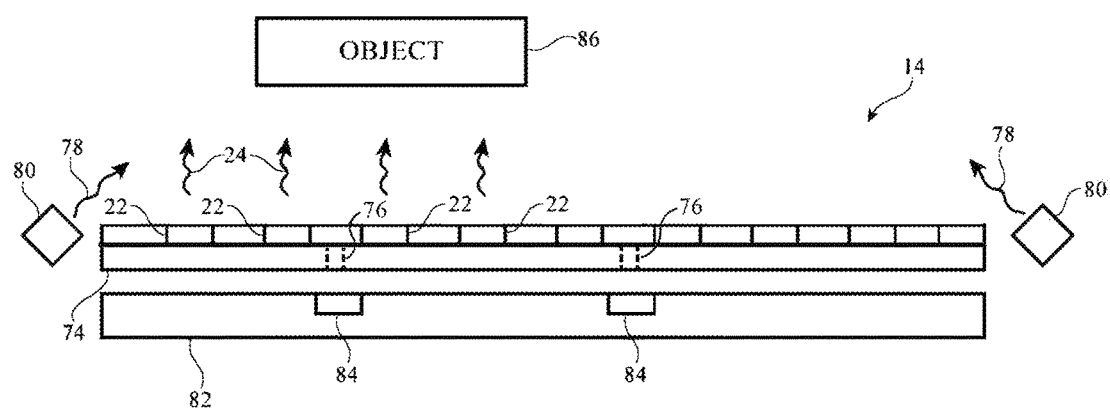
FIG. 5 is a cross-sectional side view of a display with an array of electrical components in accordance with an embodiment.

It may be desirable to incorporate electrical components into display 14 and/or device 10. As shown in FIG. 5, for example, electrical components 84 may be incorporated into device 10 under pixels 22. Components 84 may be discrete components or may be formed as part of a common integrated circuit or other shared component. Components 84 may, as an example, be mounted on a substrate such as substrate 82. Substrate 82 may be, for example, a printed circuit (e.g., a rigid printed circuit board formed from a rigid printed circuit board material such as fiberglass-filled epoxy or a flexible printed circuit formed from a flexible layer of polyimide or other sheet of polymer). Components 84 and/or substrate 82 may be integrated into the layers that make up display 14 and/or may be mounted in alignment with display 14.

Electrical components 84 may be audio components (e.g., microphones, speakers, etc.), radio-frequency components, haptic components (e.g., piezoelectric structures, vibrators, etc.), may be capacitive touch sensor components or other touch sensor structures, may be temperature sensors, pressure sensors, magnetic sensors, or other sensors, or may be any other suitable type of electrical component. With one suitable arrangement, which may sometimes be described herein as an example, electrical components 84 may be light-based components (e.g., components that emit and/or detect visible light, infrared light, and/or ultraviolet light).

Light-based components 84 may emit and/or detect light that passes through transparent windows 76 in display 14. Windows 76 may be formed by selectively removing subpixels from a subset of pixels 22 in the array of pixels forming display 14. Examples of light-based components 84 that emit light include light-emitting diodes (e.g., organic light-emitting diodes, discrete crystalline light-emitting diode dies, etc.), lasers, and lamps. Examples of light-based components that detect light include light detectors such as photodiodes and phototransistors. Some components may, if desired, include both light emitters and detectors. For example, components 84 may emit infrared light and may include light detector structures for detecting a portion of the emitted light that has reflected from nearby objects such as object 86. Components of this type may be used to implement a proximity detector, a light-based fingerprint sensor (e.g., when object 86 is the finger of a user), or other light-based sensor. If desired, light-based sensors such as these may be implemented by illuminating object 86 with light 24 from one or more of pixels 22 and/or light 78 from one or more supplemental light sources such as discrete light-emitting diodes 80, while using light-detecting components 84 to gather reflected light from object 86.

Control circuitry 16 may be used in controlling the emission of light from light sources such as pixels 22, components 84, and/or light sources 80 and may be used in processing corresponding detected light from components 84 (e.g., to generate a proximity sensor signal based on light reflected from object 86, to generate a fingerprint reading based on light reflected from object 86, to process a captured digital image of a far-field object, that is captured using components 84, etc.).

Components 84 and windows 76 may be interspersed with pixels 22 using any suitable arrangement. With one illustrative configuration, windows 76 and components 84 are arranged in an array that has a larger pitch than the array of pixels 22 in display 14. There may be, for example, one window 76 and one corresponding component 84 for each set of 10-1000 pixels 22, for each set of 100-10,000 pixels, for each set of more than 500 pixels, or for each set of less than 5000 pixels (as examples). In configurations such as these, pixels 22 are arranged on display 14 with a finer pitch than windows 76 and components 84. Pixels 22 may, for example, be organized in an array having rows and columns and windows 76 and components 84 may be arranged in an array having a smaller number of rows and columns (e.g., in a rectangular patch that consumes less than 20%, less than 10%, less than 5%, more than 1%, or other suitable amount of the total area of display 14). Configurations in which windows 76 and components 84 are arranged in patterns other than rectangular arrays may also be used. Arrangements in which windows 76 and components 84 are arranged in rows and columns may sometimes be described herein as an example.

The pixels of display 14 may include red, green, and blue subpixels or subpixels of other colors. To create an array of windows 76, some of the subpixels in an array of pixels may be selectively replaced with window structures. The human eye is less sensitive to blue and red light than green light, so with one suitable arrangement blue subpixels and/or red subpixels can be selectively replaced with windows 76. Surrounding subpixels can then be overdriven to produce light that compensates for the loss of light from the replaced subpixels. If desired, the subpixel of a pixel adjacent to a window can be enlarged to help compensate for the loss of light.

Figure 6:
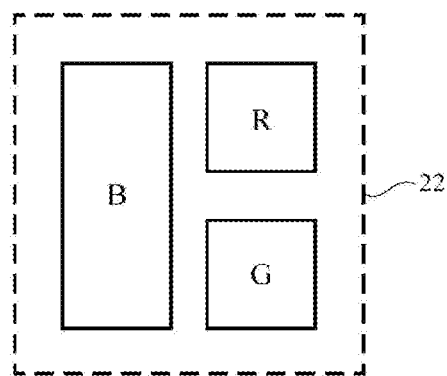
FIG. 6 is a diagram of an illustrative pixel that contains a full set of subpixels and no light-transparent windows in accordance with an embodiment.
Figure 7:
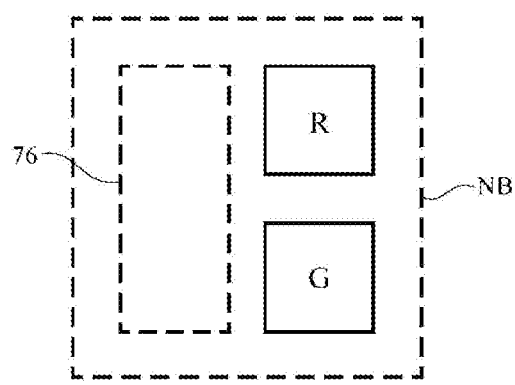
FIG. 7 is a diagram of an illustrative pixel that includes a light-transparent window formed in a location that would otherwise be occupied by a blue subpixel in accordance with an embodiment.
Figure 8:
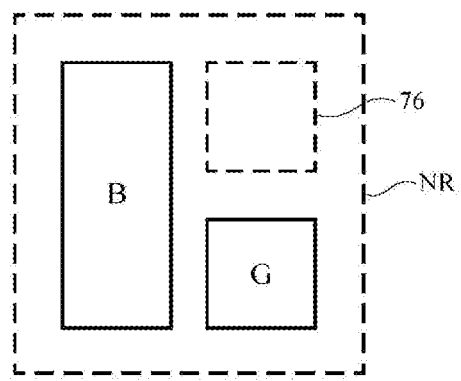
FIG. 8 is a diagram of an illustrative pixel that includes a light-transparent window formed in a location that would otherwise be occupied by a red subpixel in accordance with an embodiment.

FIGS. 6, 7, and 8 show how subpixels can be selectively replaced with windows. Pixel 22 of FIG. 6 contains all of its subpixels: red subpixel R, green subpixel G, and blue subpixel B. Illustrative pixel NB of FIG. 7 includes red subpixel R and green subpixel G, but blue subpixel B has been replaced with light transmitting window 76. Illustrative pixel NR of FIG. 8 includes blue subpixel B and green subpixel G, but red subpixel R has been replaced with light transmitting window 76.

Figure 9:
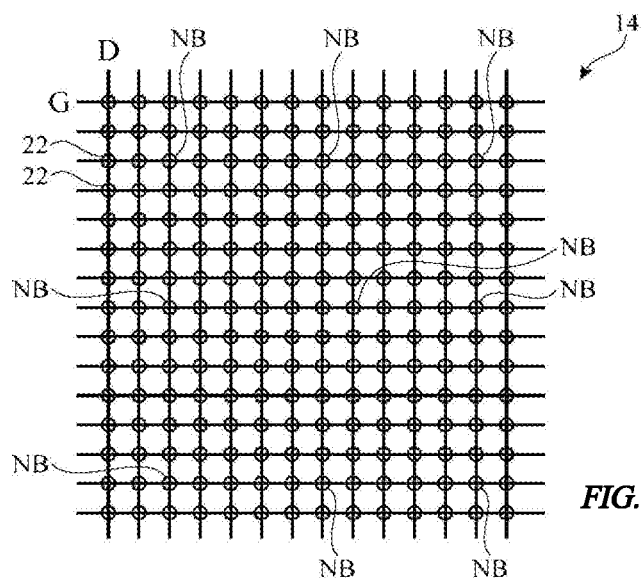
FIG. 9 is a diagram of an illustrative pixel array that includes an array of light-transparent windows formed in locations that would otherwise be occupied by blue subpixels in accordance with an embodiment.
Figure 10:
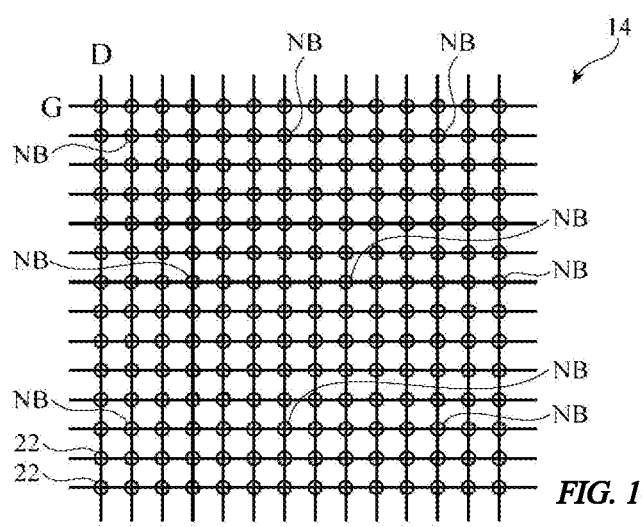
FIG. 10 is a diagram of an illustrative pixel array that includes an array of light-transparent windows formed in locations that would otherwise be occupied by blue subpixels and in which successive rows of light-transparent windows are staggered with respect to each other in accordance with an embodiment.
Figure 11:
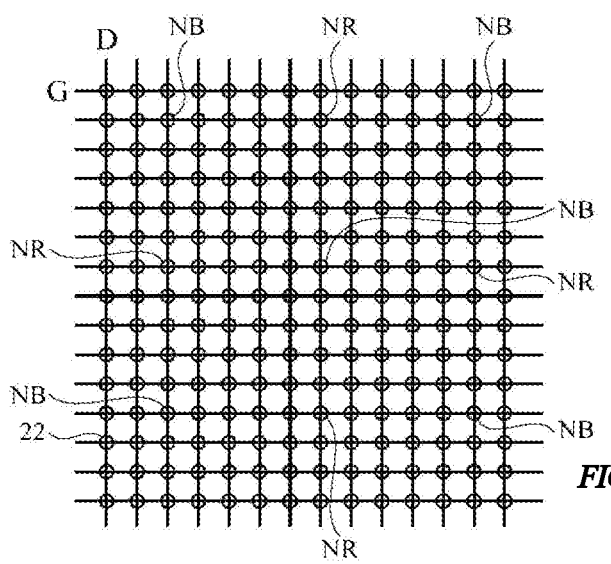
FIG. 11 is a diagram of an illustrative pixel array that includes an array of light-transparent windows formed in locations that would otherwise be occupied by red subpixels in accordance with an embodiment.

FIGS. 9, 10, and 11 show illustrative pixel arrays in which some of the pixels have been configured to include windows. In the example of FIG. 9, pixels 22 contain red, green, and blue subpixels (see, e.g., pixel 22 of FIG. 9), whereas pixels NB contain no blue subpixels but rather include windows 76. Each row of pixels NB has the same horizontal position. In the illustrative configuration of FIG. 10, each row of pixels NB is staggered with respect to the next (i.e., the pixels NB in the second row of the array of pixels NB of FIG. 10 has been horizontally offset with respect to the pixels NB in the first row of the array of pixels NB in FIG. 10). FIG. 11 shows how pixels NB and pixels NR may be interspersed with each other when forming an array of pixels containing windows 76.

Figure 12:
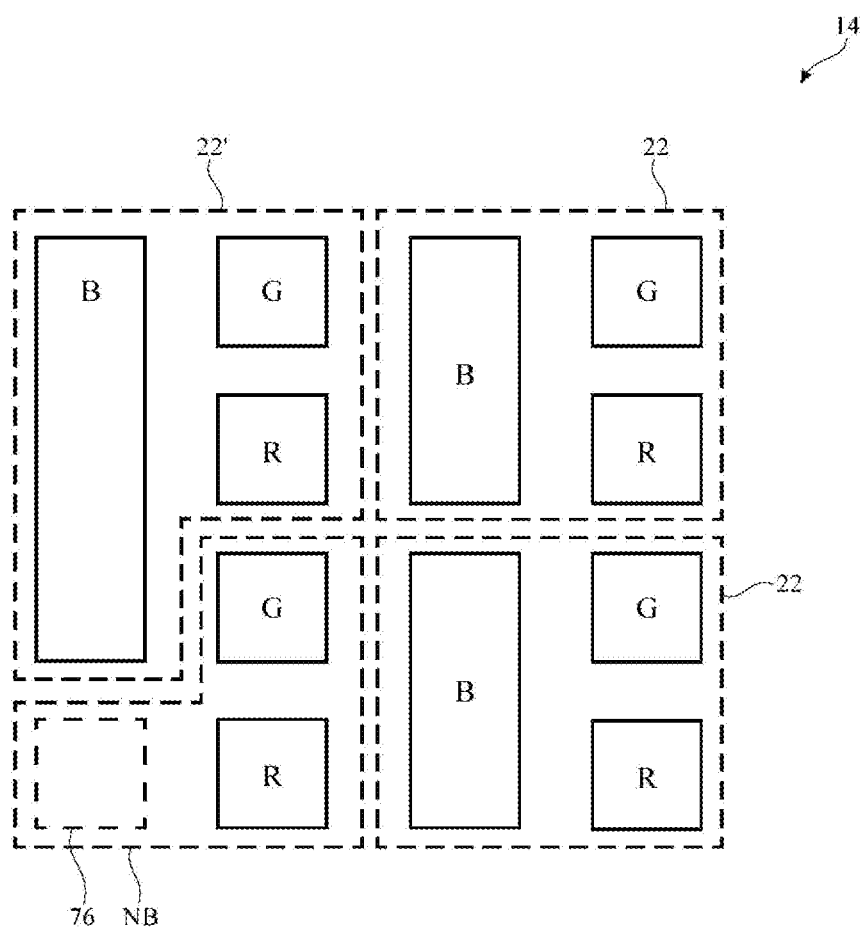
FIG. 12 is a diagram of a portion of an illustrative pixel array showing how subpixel structures may be organized to create space for a light-transmitting window in accordance with an embodiment.

To help suppress visible artifacts on display 14, the amount of blue light produced by one or more of the pixels 22 adjacent to each pixel NB and the amount of red light produced by one or more of the pixels 22 adjacent to each pixel NR may be increased when displaying images on display 14. If desired, the size of the subpixels (i.e., the size of the anodes and overlapping emissive material) that are adjacent to the replaced subpixels may be increased to help compensate for the loss of light from the replaced subpixels. Consider, as an example, the arrangement of FIG. 12. In the FIG. 12 example, subpixel NB has a red subpixel R and a green subpixel G. Blue subpixel B is not present in subpixel NB to make space available for window 76. Because blue subpixel B is absent from subpixel NB, the size of adjacent blue subpixel B in adjacent pixel 22' has been increased. The increase in size of subpixel B (and the additional current that is provided to subpixel B) in pixel 22' during image display operations may compensate for the loss of blue light due to the missing blue subpixel in pixel NB. The enlarged subpixel of pixel 22' may therefore help suppress visible artifacts due to the presence of window 76 in place of the blue subpixel. If desired, a red subpixel in a pixel adjacent to a missing red subpixel may be enlarged in the same way. Subpixels of other colors can also be enlarged and/or multiple adjacent subpixels can be enlarged.

The foregoing is merely illustrative and various modifications can be made to the described embodiments. The foregoing embodiments may be implemented individually or in any combination.

What is claimed is:

1. An electronic device, comprising:
 a display having pixels that emit light, wherein the pixels include first pixels and second pixels and wherein at least the second pixels contain light transmitting windows; and
 electrical components that are each aligned with and receive light through a respective one of the light transmitting windows.

2. The electronic device defined in claim 1 wherein the electrical components comprise light detectors.

3. The electronic device defined in claim 2 wherein the first pixels each include at least first, second, and third subpixels of different colors.

4. The electronic device defined in claim 3 wherein the second pixels each include at least a pair of subpixels of different colors.

5. The electronic device defined in claim 4 wherein the first subpixels of the first pixels are red subpixels, wherein the second subpixels of the first subpixels are green subpixels, and wherein the third subpixels of the first pixels are blue subpixels.

6. The electronic device defined in claim 5 wherein the second pixels each include red and green subpixels and no blue subpixels.

7. The electronic device defined in claim 5 wherein the second pixels each include blue and green subpixels and no red subpixels.

8. The electronic device defined in claim 5 wherein the second pixels include some pixels with red and green subpixels and no blue subpixels and include some pixels with blue and green subpixels and no red subpixels.

9. The electronic device defined in claim 8 wherein the second pixels are interspersed with the first pixels and are arranged in an array.

10. The electronic device defined in claim 9 wherein successive rows of the second pixels in the array are staggered with respect to each other.

11. The electronic device defined in claim 5 wherein each of the first pixels in a group of the first pixels is adjacent to a respective one of the second pixels and wherein each of the first pixels in the group of first pixels has a light-emitting diode that is larger than the first pixels that are not in the group of the first pixels.

12. The electronic device defined in claim 1, wherein the first pixels do not contain light transmitting windows.

13. A display, comprising:
 an array of pixels, wherein a first set of the pixels includes subpixels of first, second, and third colors and wherein a second set of the pixels includes subpixels of the first and second colors and no subpixels of the third color; and
 an array of light transmitting windows, wherein each of the light transmitting windows is formed within a respective one of the pixels in the second set of pixels.

14. The display defined in claim 13 further comprising:
 an array of light sensors each of which is aligned with a respective one of the light transmitting windows in the array of light transmitting windows.

15. The display defined in claim 14 wherein the light sensors are configured to capture a fingerprint using light that passes to the light sensors through the array of light transmitting windows.

16. The display defined in claim 14 wherein the first, second, and third colors are red, green, and blue, respectively.

17. The display defined in claim 14 wherein the first, second, and third colors are green, blue, and red, respectively.

18. An organic light-emitting diode display, comprising:
 an array of pixels each of which contains subpixels and some of which contain light transmitting windows; and
 light sensors that receive light through the light transmitting windows.

19. The organic light-emitting diode display defined in claim 18 wherein the array of pixels has a first area that overlaps the light sensors and a second area that does not overlap the light sensors.

20. The organic light-emitting diode display defined in claim 19 wherein each of the pixels in the second area includes red subpixels, green subpixels, and blue subpixels.

21. The organic light-emitting diode display defined in claim 20 wherein some of the pixels in the first area each include red subpixels, green subpixels, and blue subpixels, wherein some of the pixels in the first area each include red and green subpixels and no blue subpixels, wherein the light sensors are arranged in an array, and wherein the light transmitting windows are formed in the pixels that include the red and green subpixels and no blue subpixels and take the place of blue subpixels.

\* \* \* \* \*